(12) United States Patent
Bollin

(10) Patent No.: US 7,436,287 B1
(45) Date of Patent: Oct. 14, 2008

(54) AUXILIARY GENERATOR SELF-TEST VERIFICATION DEVICE

(76) Inventor: Daniel L. Bollin, 8720 Birch Bark Dr., Sylvania, OH (US) 43560

( * ) Notice: Subject to any disclaimer, the term of this patent is extended or adjusted under 35 U.S.C. 154(b) by 493 days.

(21) Appl. No.: 11/190,733

(22) Filed: Jul. 27, 2005

Related U.S. Application Data

(60) Provisional application No. 60/598,643, filed on Aug. 4, 2004.

(51) Int. Cl.
G08B 1/00 (2006.01)
(52) U.S. Cl. ................................. 340/309.16
(58) Field of Classification Search ........... 340/309.16, 340/679, 635, 539.17; 320/134–136
See application file for complete search history.

(56) References Cited

U.S. PATENT DOCUMENTS

| | | | | |
|---|---|---|---|---|
| 4,223,307 A | * | 9/1980 | Albritton | 340/656 |
| 4,323,820 A | | 4/1982 | Teich | |
| 4,471,233 A | | 9/1984 | Roberts | |
| 4,686,379 A | | 8/1987 | Ohnari | |
| 4,703,191 A | * | 10/1987 | Ferguson | 307/64 |
| 4,751,629 A | | 6/1988 | Shimizu et al. | |
| 5,191,229 A | | 3/1993 | Davis et al. | |
| 5,264,732 A | | 11/1993 | Fiorina et al. | |
| 5,268,850 A | * | 12/1993 | Skoglund | 700/297 |
| 5,568,129 A | * | 10/1996 | Sisselman et al. | 340/628 |
| 5,663,711 A | * | 9/1997 | Sanders et al. | 340/635 |
| 5,734,239 A | * | 3/1998 | Turner | 318/142 |
| 5,801,635 A | * | 9/1998 | Price | 340/656 |
| 5,903,065 A | | 5/1999 | Dragos | |
| 5,984,719 A | | 11/1999 | Flegel | |
| 6,107,692 A | | 8/2000 | Egri et al. | |
| 6,366,211 B1 | * | 4/2002 | Parker | 340/693.2 |
| 6,420,801 B1 | | 7/2002 | Seefeldt | |
| 6,593,670 B2 | | 7/2003 | Anderson | |
| 6,605,878 B1 | * | 8/2003 | Arce | 307/64 |
| 6,657,416 B2 | | 12/2003 | Kern et al. | |
| 6,707,169 B2 | | 3/2004 | Shimizu et al. | |
| 6,850,043 B1 | * | 2/2005 | Maddali | 322/25 |
| 2006/0152379 A1 | * | 7/2006 | Lewis | 340/679 |

* cited by examiner

Primary Examiner—Jeff Hofsass
Assistant Examiner—Edny Labbees
(74) Attorney, Agent, or Firm—MacMillan, Sobanski & Todd, LLC

(57) ABSTRACT

A device for monitoring the self-testing of an auxiliary generator provides an alarm signal if the generator does not start and operate within a predetermined time period.

22 Claims, 3 Drawing Sheets

AUXILIARY GENERATOR SELF-TEST VERIFICATION DEVICE

CROSS-REFERENCE TO RELATED APPLICATIONS

This application claims the benefit of U.S. Provisional Application No. 60/598,643, filed Aug. 4, 2004, the disclosure of which is incorporated herein by reference.

BACKGROUND OF THE INVENTION

This invention relates in general to auxiliary electrical generators having a self-testing capability and in particular to a device for automatically verifying satisfactory operation of the self-testing capability of auxiliary electrical generators.

Increasing concern over the reliability of commercial electric utility companies has resulted in the installation of auxiliary electrical generating units in many residences and small commercial establishments. Such generators typically include a prime mover coupled to a small electric generator. The prime mover is selected to utilize an available fuel, such as, for example, gasoline, diesel fuel, propane or natural gas. A control unit detects failure of the commercial source of electric power and is operable to isolate the electrical circuit of the residence or commercial establishment from the commercial electric power grid. The control unit then starts the prime mover and connects the generator output to supply electrical power to the electrical circuit of the residence or commercial establishment. The control unit also detects the return to service of the commercial electric power grid and is operative to disconnect the generator, reconnect the residence or commercial establishment to the commercial grid and shut down the generator prime mover.

Auxiliary electric generators are available in various sizes so that the particular unit may be matched to the anticipated electrical load. To assure that the auxiliary electric generators will respond to a power outage, the generator control units typically include a self-test feature that periodically starts the prime mover and verifies that the generator is operable to supply electric energy. The period between tests is preset by the auxiliary generator manufacturer or user and may range from weekly to monthly. However, auxiliary generators generally lack a means to verify that the self-test has been successfully completed other than observing the operation of the unit. Accordingly, it would be desirable to provide a device to verify that the generator self-test has been successfully completed.

BRIEF SUMMARY OF THE INVENTION

This invention relates to a device for verifying satisfactory operation of the self-testing capability of auxiliary electrical generators.

The present invention contemplates a device for verifying the self-testing function of an auxiliary electric generator that includes a timer adapted to be connected to an output of the auxiliary generator. The device also includes an alarm device connected to the timer with the timer being operative to activate the alarm device upon a predetermined period passing without detection of energization of the auxiliary generator output. The invention also contemplates that the timer is operative to reset upon detection of energization of the auxiliary generator output. In the preferred embodiment, the timer is included within a microprocessor.

The present invention also contemplates a method for verifying the self-testing function of an auxiliary electric generator that includes the steps of providing the device described above. The method also includes monitoring the generator output and actuating the alarm device upon a predetermined period passing without the generator being started for a self-test. The method further includes resetting the timer upon detection of energization of the auxiliary generator output.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
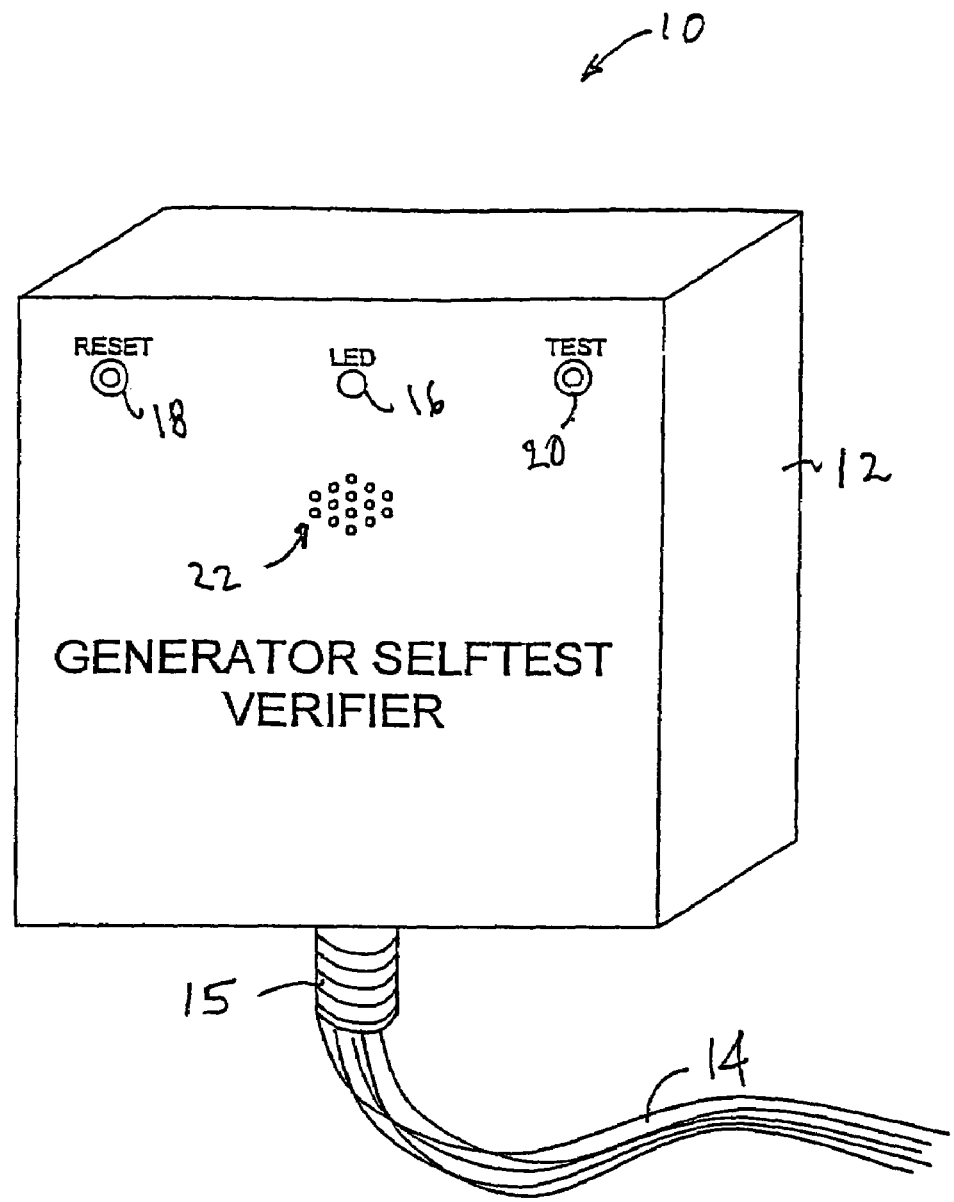
FIG. 1 is a perspective view of an auxiliary electric generator self-test verification device in accordance with the invention.

Referring now to the drawings, there is illustrated in FIG. 1 an auxiliary electric generator self-test verification device 10 that is in accordance with the invention. The device is contained in a small housing 12 and connected to the auxiliary generator by multi-conductor cable 14. In the preferred embodiment, the housing 12 is formed from plastic; however, other materials, such as, for example, steel and aluminum, also may be utilized to form the housing 12. The cable 14 allows mounting of the device 10 adjacent to the auxiliary generator. The housing 12 is fitted with a threaded assembly 15 to allow the device to be mounted to a standard 0.5" knockout. The cable wires protrude through the bottom of the threaded assembly 15 and are color coded for easy identification. An activity LED 16 is mounted upon the front surface of the housing 12 with RESET and TEST pushbuttons 18 and 20, respectively. Also, a plurality of small apertures 22 are formed through the front housing surface to allow transmission of an audible alarm through the housing 12.

Figure 2:
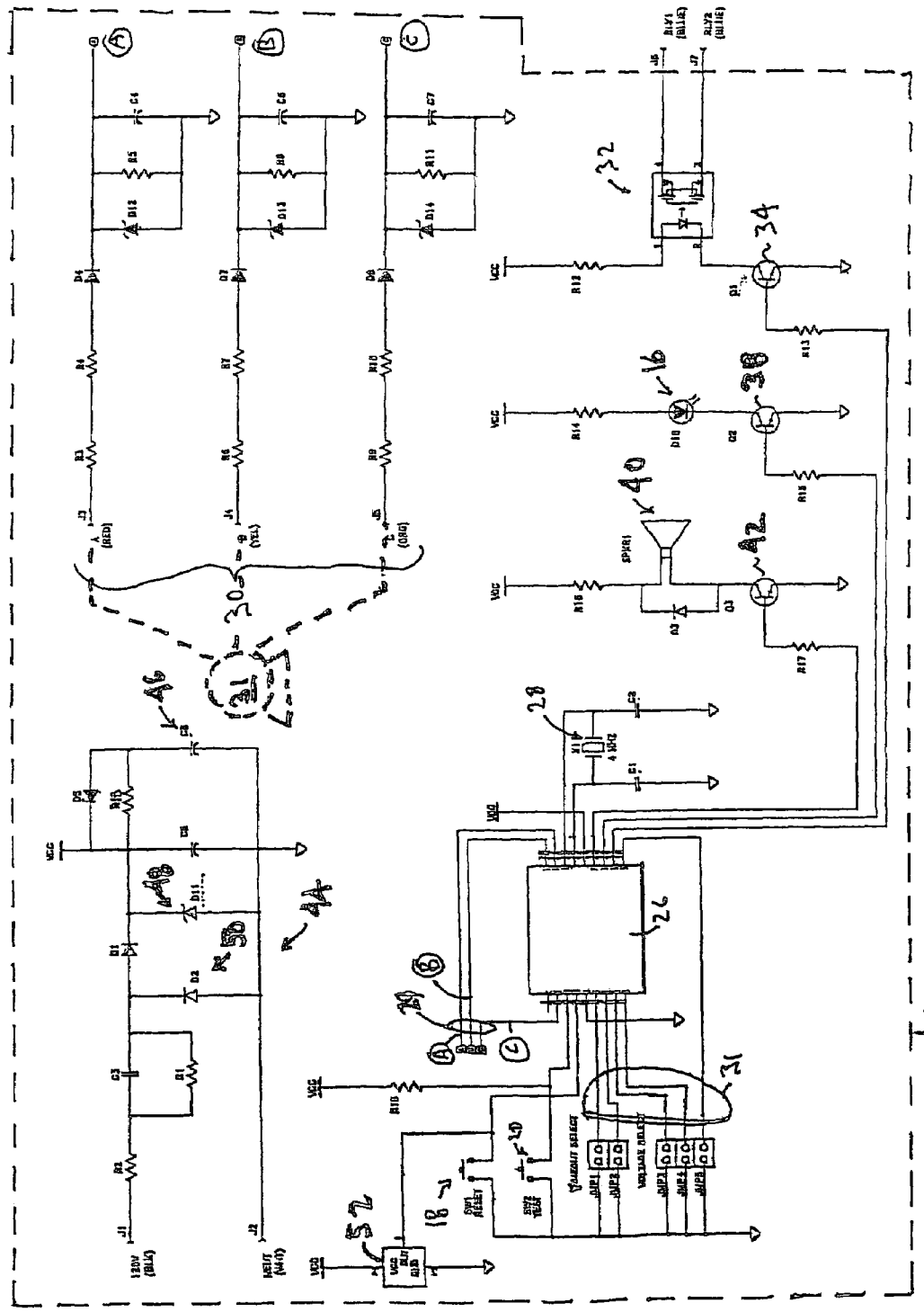
FIG. 2 is a circuit diagram for the device shown in FIG. 1.

A schematic circuit diagram of the device 10 is shown in FIG. 2. The circuit includes a microprocessor 26 that controls the operation of the device 10 and includes a timer function. The time base for the timer function is provided by an inexpensive crystal 28. The microprocessor 26 contains an on-chip 8-bit analog-to-digital converter that is used to measure the amplitude of the input voltages. The expected accuracy of the voltage measurement circuitry is 10%.

The microprocessor 26 also is operative to monitor the operation of the associated auxiliary generator. Three generator voltage input pins 29 on the microprocessor 26 receive input signals from three input circuits 30 that are labeled "A", "B" and "C" in FIG. 2. Each of the input circuits 30 includes a filter and a voltage regulating Zener diode and are connected to the electrical outputs of an auxiliary generator 31. The input circuits 30 are operative to make the corresponding generator voltage input pin 29 on the microprocessor 26 go to a corresponding analog voltage level when the generator is started.

Several other I/O pins of the microprocessor 26 are configured as inputs with one input pin connected through the RESET pushbutton 18 to ground and a second input pin connected through the TEST pushbutton 20 to ground. Thus, depressing either the RESET or TEST pushbutton 18 or 20 will pull the corresponding microprocessor input pin to ground. Five other input pins are configured as jumper inputs 31, for setting the device timing cycle and device calibration for the generator output, as described below. Three I/O pins are configured as outputs, one to drive the activity LED 16, one to drive an alarm relay 32, and one to drive an audible alarm 40.

periods may be selected. In addition to detecting the presence of the "hot" lead, the circuitry will also determine if the voltage falls within a pre-determined voltage window. This allows for detection of over-voltage and under-voltage generator output conditions. The accuracy of the detection circuitry is estimated to be 10% of full scale. The possible combinations for the lower three jumper inputs are shown in the following table:

| Jmp 3 | Jmp 2 | Jmp 1 | Typical Generator Output | Allowable Generator Voltage Output (Ø-NEUT) | Connections (NEUT of 120 serves as reference) |
|---|---|---|---|---|---|
| Out | Out | Out | 1Ø 120/240 | 90 to 130 | 2 hot leads to Input A, B |
| Out | Out | In | 3ØY 120/208 | 90 to 130 | 3 hot leads to Inputs A, B, C |
| Out | In | Out | 3ØY 277/480 | 231 to 300 | 3 hot leads to Inputs A, B, C |
| Out | In | In | 3ØY 220/380 | 185 to 243 | 3 hot leads to Inputs A, B, C |
| In | Out | Out | 3ØΔ 240 | 200 to 260 | 2 hot leads to Inputs A, B (see Note 1) |
| In | Out | In | 3ØΔ 480 | 400 to 520 | 2 hot leads to Inputs A, B (see Note 1) |
| In | In | Out | <<reserved>> | <<reserved>> | <<reserved>> |
| In | In | In | <<reserved>> | <<reserved>> | <<reserved>> |

In the preferred embodiment, the upper two jumper inputs shown in FIG. 2 that are labeled JMP1 and JMP2 provide four possible timer cycles, or timeout intervals, as shown in the following table:

| Jumper 1 | Jumper 2 | Timeout |
|---|---|---|
| Out | Out | 8 days |
| Out | In | 15 days |
| In | Out | 22 days |
| In | In | 32 days |

The invention contemplates that the microprocessor 26 triggers an alarm if the timeout interval expires without the auxiliary generator being started and producing electricity during the selected timeout interval. The timeout interval is selected to match the self-test period for the auxiliary generator plus one day. Thus, for example, if the auxiliary generator is programmed to be test started every seven days, the eight day timeout interval would be selected. Then, if eight days pass without the auxiliary generator being started and producing electricity, the microprocessor 26 is operable to trigger the alarm.

The microprocessor 26 is further operable to reset the timeout interval when production of electricity by the auxiliary generator for a predetermined time period is detected. While jumpers are described above, it will be appreciated that other devices, such as micro-switches, also may be used to select the timeout duration. The time out intervals shown in the above table are intended to be exemplary, and the invention contemplates that other timeout intervals than those shown in the table may be used.

Figure 3:
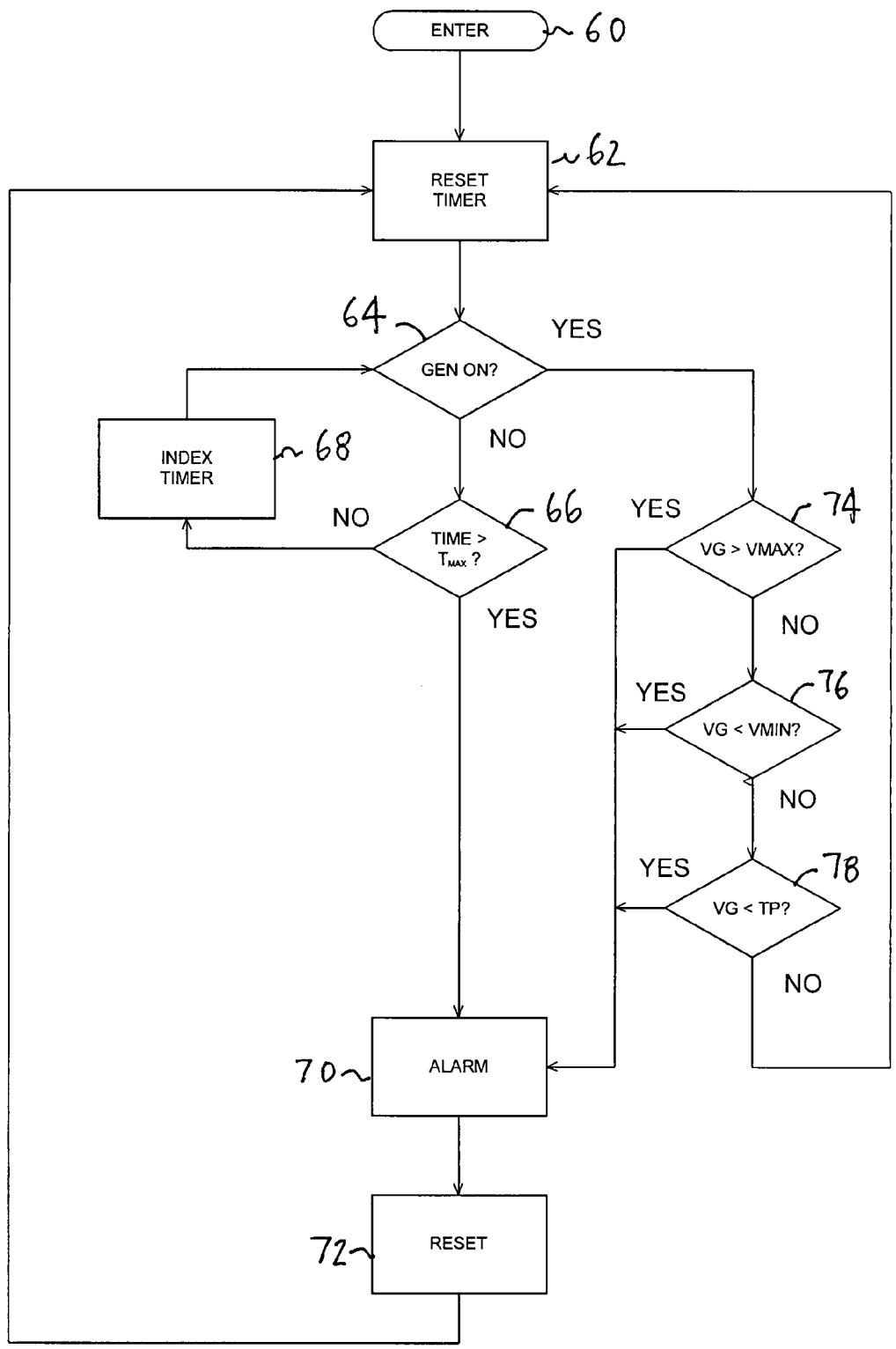
FIG. 3 is a flow chart illustrating the operation of the device shown in FIG. 1.

The lower three jumper inputs shown in FIG. 3 that are labeled JMP3, JMP4 and JMP5 allow the device 10 to be configured for different reset signals received upon the inputs to the device from the auxiliary generator output. The voltage select jumpers allow for connection to either a single or a three phase generator. In the preferred embodiment, the device 10 will be reset when all of the selected "hot" auxiliary generator leads are present for a time period of 2 minutes or more; however, other time periods for resetting the device 10

If the auxiliary generator is configured as a 3ØΔ voltage supply, one lead of the Δ secondary must be connected to earth ground. While jumpers are described above, it will be appreciated that other devices, such as micro-switches, also may be used to select the timeout duration.

An alarm relay 32 provides a connection from the device 10 to an external alarm reporting device (not shown) In the preferred embodiment, the alarm relay 32 is a semiconductor relay; however, the invention also may be practiced with a conventional mechanical relay (not shown). The selection of a semiconductor relay assures low power consumption and the "contacts" of a typical semiconductor relay are typically limited to 100 mA maximum. While such a rating is fine for low voltage alarm triggering, an external relay would be provided if a large external load is desired. In the preferred embodiment, the relay 32 is connected to digital dialer (not shown) that would automatically notify a remote location, such as, for example, a central station, an emergency response facility or a generator maintenance facility, should the generator fail to perform the self-test within the predetermined time interval.

As shown in FIG. 2, the alarm relay 32 is connected between a voltage supply $V_{cc}$ and one end of an electronic switch 34. The other end of the switch 34 is connected to ground so that when the switch is in a conducting state, an activation current flows through the relay. The switch 34 has a control terminal connected to a relay output pin on the microprocessor 26 that supplies a control signal to the switch 34. While a bipolar transistor having a base connected to the microprocessor output pin is shown in FIG. 2, it will be appreciated that other electronic devices also may be used, such as for example, a Field Effect Transistor (FET) having a gate terminal connected to the microprocessor output pin.

As described above, the device also includes a LED 16. The LED 16 provides an indication to the installer/user that the device 10 is operating properly. In the preferred embodiment, the LED 16 will briefly blink once every two seconds as an activity indicator. Also, in the preferred embodiment, following a self-test failure, or detection of a over or under generator output voltage, the LED 16 will blink at a faster rate to alert the user of the self-test failure condition. While the preferred embodiment utilizes a two second blink rate for the LED 16 to indicate proper operation, it will be appreciated that other rates may be used.

Similar to the relay 32, the LED 16 also is connected between a voltage supply $V_{cc}$ and one end of an electronic switch 38. The other end of the switch 38 is connected to ground so that, when the switch is a conducting state, an activation current flows through the LED 16 causing illumination of the diode. The switch 38 has a control terminal connected to a LED output pin on the microprocessor 26 that supplies a control signal to the switch 38. Thus, the LED blink rate is controlled by the microprocessor 26. While a bipolar transistor having a base connected to the microprocessor output pin is shown in FIG. 2, it will be appreciated that other electronic devices also may be used, such as for example, a Field Effect Transistor (FET) having a gate terminal connected to the microprocessor output pin.

The device 10 also has an audible alarm having an audible annunciator 40 that sounds during an alarm condition. The annunciator 40 is connected between a voltage supply $V_{cc}$ and one end of an electronic switch 42. The other end of the switch 42 is connected to ground so that when the switch is a conducting state, an activation current flows through the annunciator 40 causing an audio signal to be emitted. The switch 42 has a control terminal connected to an alarm output pin on the microprocessor 26 that supplies a control signal to the switch 42. In the preferred embodiment, the microprocessor 26 supplies a square wave (approximately 2 kHz) to the switch 42 that causes the annunciator 40 to generate the beeper tone. In the preferred embodiment, the alarm tone will not be on continuously but rather will beep at a 1 second rate (½ second on, ½ second off). An intermittent tone is deemed more noticeable than a tone that is continuously on. Also in the preferred embodiment, the audible alarm is loud enough to be heard while the user is in the same room as the transfer switch, but not loud enough to be heard in another room. Alternately, a louder beeper could be supplied or a remote alarm device that is located in another part of the residence or commercial establishment could be connected to the device 10 (not shown).

The circuit further includes a regulated power supply 44 having a large capacity backup capacitor 46 that is shown in the upper left corner of FIG. 2. The capacitor 46 is connected in parallel with a voltage regulating Zener diode 48. A pair of diodes 50 rectify the alternating input voltage. To minimize cost, the preferred embodiment employs a "transformerless" design which reduces a 120 volt supply to about five volts DC, labeled $V_{cc}$ in FIG. 2, without use of a transformer. However, the invention also may be practiced with a step down transformer (not shown) included in the power supply 44. The power supply backup capacitor 46 supplies power to the generator self-test verification device 10 during the brief time between a true power failure and the generator starting up. The backup capacitor 46 also ensures that the timeout interval is not reset during a brief utility power outage or brownout condition. In the preferred embodiment, the backup capacitor 46 supplies power to the generator self-test verification device 10 for about 30 seconds, which is enough time for the generator to start during either a true power outage or a self-test auto-start condition. As also shown in FIG. 2, a conventional voltage regulator 52 is included in the device 10 between the power supply 44 and the microprocessor 26.

The method of operation of the generator self-test verification device 10 will now be described in light of the flow chart shown in FIG. 3. The flow chart is entered through block 60 whenever 120V AC power is first applied from either the utility or the auxiliary generator, or the RESET pushbutton 18 is pressed. The method proceeds to functional block 62 where the microprocessor 26 will reset the timer and actuate the audible annunciator 34 to sound a quick double-beep. The double beep informs the user that the device 10 has been reset and that the timer has been reset to zero.

The method then continues to decision block 64 where the microprocessor determines whether or not the auxiliary generator has been actuated. If the generator has not been actuated due to either a true power outage or a periodic self-test, the method will transfer to decision block 66 where the total elapsed time since the last device reset is compared to the maximum allowable time $T_{MAX}$ according to the settings of the timer cycle jumpers, JMP1 and JMP2. If the maximum allowable time $T_{MAX}$ has not been exceeded, the method transfers to functional block 68 where the timer is indexed. The method then returns to decision block 64 to again check whether or not the auxiliary generator has been actuated.

If, in decision block 66, it is determined that the maximum allowable time $T_{MAX}$ has been reached or exceeded without the auxiliary generator being actuated, the method transfers to functional block 70 where the audio alarm is sounded. As described above, the device 10 is also operable to notify a remote location of the failure by closing the relay 32 and to increase the flashing frequency of the LED 16. The alarm will continue until the reset pushbutton 18 is pressed in functional block 72, at which time the method returns to functional block 62 where the microprocessor 26 again resets the timer. Pressing the reset pushbutton 18 in functional block 72 also silences the audible alarm and opens the relay contacts.

If, in decision block 64, the microprocessor determines that the auxiliary generator has been actuated, the method transfers to decision block 74 to begin to determine whether or not valid generator start conditions have been met. In the preferred embodiment, a valid generator start condition is defined as the voltage input pins 29 detecting voltages within the prescribed voltage windows shown in the second table above, as specified by the voltage select jumpers, JMP3, JMP4 and JMP5, for a duration longer than two minutes. Therefore, in decision block 74, the voltage upon the input pins 29 is compared to a maximum voltage, $V_{MAX}$. If the input pin voltage exceeds the maximum voltage $V_{MAX}$, one of the valid start conditions has not been met and the method transfers to functional block 70 where the alarm is sounded. If the input pin voltage is equal to or less than the maximum voltage $V_{MAX}$, the method transfers to decision block 76.

In decision block 76, the voltage upon the input pins 29 is compared to a minimum voltage, $V_{MIN}$. If the input pin voltage is less than the minimum voltage $V_{MIN}$, another of the valid start conditions has not been met and the method transfers to functional block 70 where the alarm is sounded. If the input pin voltage is equal to or greater than the minimum voltage $V_{MIN}$, the method transfers to decision block 78.

In decision block 78, the method checks whether the duration of auxiliary generator operation during the self-test exceeds a predetermined time period, $T_P$, which, as described above, is two minutes in the preferred embodiment. If the generator operation time is less than the predetermined time period $T_P$, the third valid start condition has not been met and the method transfers to functional block 70 where the alarm is sounded. If the generator operation time is equal to or greater than the predetermined time period, $T_P$, the method transfers to functional block 62 where the microprocessor 26 again resets the timer. Thus, during operation of the auxiliary generator, the timer is continuously reset every two minutes and is ready to begin a new timeout cycle when the auxiliary generator is shut down. If the generator voltage input pins 29 do not go to the predetermined voltage level within the timeout period, the audible alarm 34 is activated and the relay 32 closes.

It will be understood that the flow chart shown in FIG. 3 is exemplary, and the invention also contemplates practicing a method other than illustrated in FIG. 3. Furthermore, while not shown in FIG. 3, the method also includes activation of the audio alarm 34 and closure of the contacts of the relay 32 when the TEST pushbutton 20 is depressed. Additionally, the LED 16 will flash at its more rapid alarm frequency. This allows the user/installer to easily test the alarm relay 32 output connections. The test condition is removed by depressing the RESET pushbutton 18.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope. For example, while two generator voltage conditions and a running time have been described as validation conditions of proper operation of the auxiliary generator, the invention also may be practiced with only one or two of the validation conditions being checked. Alternately, the generator start validation conditions may be eliminated, additional validation conditions included, or entirely different validation conditions may be utilized. Additionally, while the preferred embodiment has been described and illustrated as utilizing a microprocessor, it will be appreciated that the invention also may be practiced with another device, such as, for example, an Applied Specific Integrated Circuit (ASIC) or other similar device.

What is claimed is:

1. A device for verifying the self-testing function of an auxiliary electric generator that includes starting the auxiliary electric generator for energizing the output of the auxiliary electric generator to verify that the generator is operable to supply electric energy after an auxiliary generator test period expires, the device comprising:
    a timer adapted to be connected to an output of the auxiliary generator;
    an alarm device connected to said timer, said timer being operative to activate said alarm device upon a predetermined timeout interval passing without detection of energization of the auxiliary electric generator output, said predetermined timeout interval being greater than the auxiliary generator self-test period.

2. The device according to claim 1 wherein said timer is also operative to reset to begin a new predetermined timeout interval upon detection of energization of the auxiliary generator output.

3. The device according to claim 2 wherein said timer is included in a microprocessor that is also adapted to be connected to the auxiliary generator output, said microprocessor operable to detect a failure of an auxiliary electric generator self-test function.

4. The device according to claim 3 wherein said alarm device includes an electrically energized annunciator that generates an audio signal.

5. The device according to claim 3 further including a relay connected to said microprocessor, said relay adapted to be connected to an external circuit, said microprocessor being operable to selectively energize said relay upon the auxiliary electric generator failing to complete an auxiliary electric generator self-test within said time out interval whereby said external circuit is actuated.

6. The device according to claim 5 wherein said external circuit includes an automatic telephone dialer that is operable to alert a remote location upon actuation of said external circuit.

7. The device according to claim 3 further including a visual indicator connected to said microprocessor, said microprocessor operable to cause said visual indicator to provide a first indication when the device is operating properly, said microprocessor also operable, upon detection of failure of an auxiliary electric generator self-test function, to actuate said visual indicator to provide a second indication that there has been an auxiliary electric generator self-test failure.

8. The device according to claim 7 wherein said visual indicator is a Light Emitting Diode.

9. The device according to claim 3 further including a reset switch connected to said microprocessor, said reset switch operable upon closure to reset said microprocessor timer to initiate a new time out interval for the auxiliary generator self-test.

10. The device according to claim 9 wherein said reset switch is a pushbutton.

11. The device according to claim 3 further including a test switch connected to said microprocessor, said test switch operable upon closure to cause said microprocessor to actuate said alarm to demonstrate that said alarm is operable.

12. The device according to claim 11 wherein said test switch is a pushbutton.

13. The device according to claim 3 wherein said microprocessor is further operable to monitor at least one operating parameter of the auxiliary generator, said microprocessor also operable to actuate said alarm during a generator self-test upon said operating parameter failing to meet a predetermined threshold.

14. The device according to claim 13 wherein said operating parameter is the auxiliary generator output voltage and further wherein said microprocessor is operable to actuate said alarm during a generator self-test upon determining that the output voltage exceeds a predetermined maximum output voltage.

15. The device according to claim 14 wherein said operating parameter is the auxiliary generator output voltage and further wherein said microprocessor is operable to actuate said alarm during a generator self-test upon determining that the output voltage is less than a predetermined minimum output voltage.

16. The device according to claim 13 wherein said operating parameter is the auxiliary generator operating time duration and further wherein said microprocessor is operable to actuate said alarm during a generator self-test upon determining that the generator operating time duration is less than a predetermined time period.

17. The device according to claim 2 wherein said timer is included in an Applied Specific Integrated Circuit that is also adapted to be connected to the auxiliary generator output, said Applied Specific Integrated Circuit operable to detect a failure of an auxiliary electric generator self-test function.

18. A method for verifying a self test function of an auxiliary electric generator that includes starting the auxiliary electric generator for energizing the output of the auxiliary electric generator to verify that the generator is operable to supply electric energy after an auxiliary generator self-test period expires, the method comprising the steps of:
    (a) providing a microprocessor that includes a timer and that is operable to be connected to an output of the auxiliary electric generator, the timer being connected to an alarm device;

(b) monitoring the generator output; and
(c) actuating the alarm device upon a predetermined timeout interval passing without the auxiliary electric generator being energized for a self-test, the timeout interval being greater than the auxiliary generator self-test period.

19. The method of claim 18 wherein the microprocessor also is connected to a relay and step (c) also includes actuating the relay whereby a remote facility is alerted to the failure of the generator self test.

20. The method of claim 18 wherein step (b) also includes monitoring at least one operating parameter of the auxiliary generator and step (c) includes actuating the alarm during a generator self-test upon the operating parameter failing to meet a predetermined threshold.

21. The method of claim 18 wherein the generator operating parameter monitored in step (b) is the generator output voltage level and the alarm is actuated in step (c) when the output voltage level is outside of a predetermined operating voltage range.

22. The method of claim 18 further including in step (c) resetting the timer to begin a new predetermined timeout interval upon detection of energization of the auxiliary generator output.

* * * * *